(12) United States Patent
Jiang et al.

(10) Patent No.: US 10,212,856 B2
(45) Date of Patent: Feb. 19, 2019

(54) WATER COOLING SYSTEM OF SINGLE BOARD MODULE LEVEL

(71) Applicant: ZTE CORPORATION, Guangdong (CN)

(72) Inventors: Wenbing Jiang, Guangdong (CN); Jianfeng Li, Guangdong (CN)

(73) Assignee: ZTE CORPORATION, Guandong (CN)

( * ) Notice: Subject to any disclaimer, the term of this patent is extended or adjusted under 35 U.S.C. 154(b) by 0 days.

(21) Appl. No.: 15/746,569

(22) PCT Filed: Feb. 16, 2016

(86) PCT No.: PCT/CN2016/073883
§ 371 (c)(1),
(2) Date: Jan. 22, 2018

(87) PCT Pub. No.: WO2017/012336
PCT Pub. Date: Jan. 26, 2017

(65) Prior Publication Data
US 2018/0228058 A1    Aug. 9, 2018

(30) Foreign Application Priority Data

Jul. 23, 2015   (CN) .................... 2015 2 0535827 U

(51) Int. Cl.
*H05K 7/20* (2006.01)
*G06F 1/20* (2006.01)
(Continued)

(52) U.S. Cl.
CPC .......... *H05K 7/20772* (2013.01); *G06F 1/20* (2013.01); *H01L 23/34* (2013.01);
(Continued)

(58) Field of Classification Search
CPC .......... H05K 7/20772; H05K 7/20272; H05K 7/20281
See application file for complete search history.

(56) References Cited

U.S. PATENT DOCUMENTS

2005/0052848 A1 * 3/2005 Hamman .............. F28D 1/0535
                                                          361/701
2005/0068728 A1 * 3/2005 Chu ......................... G06F 1/20
                                                          361/690
(Continued)

FOREIGN PATENT DOCUMENTS

CN    100568493    * 12/2009  .............. G06F 1/20
CN    203504428    *  3/2014  .............. H02M 7/00

*Primary Examiner* — Adrian S Wilson
(74) *Attorney, Agent, or Firm* — Nath, Goldberg & Meyer; Joshua B. Goldberg

(57) ABSTRACT

A water cooling system of single board module level comprises: a device subrack (1), provided with a backplate (2); multiple single board modules (3), located on one side of the backplate (2); multiple single board water-cooling modules (4), mounted on the corresponding board modules (3) and having liquid for cooling a heating element of the single board modules (3); multiple sealing plug-connection units (5) mounted on the backplate (2) and connected to the single board water-cooling modules (4); and multiple water pump modules (11) connected to the multiple single board water-cooling modules (4) by means of the multiple sealing plug-connection units (5), wherein the water pump modules (11) are located on the other side of the backplate (2). The water cooling system of single board module level has a simple structure, saves space, and has a high device maintenance efficiency.

20 Claims, 3 Drawing Sheets

(51) Int. Cl.
*H01L 23/34* (2006.01)
*H05K 7/14* (2006.01)

(52) U.S. Cl.
CPC ..... *H05K 7/20272* (2013.01); *H05K 7/20781* (2013.01); *H05K 7/20836* (2013.01); *G06F 2200/201* (2013.01); *H05K 7/1489* (2013.01)

(56) References Cited

U.S. PATENT DOCUMENTS

| | | | |
|---|---|---|---|
| 2007/0125523 A1* | 6/2007 | Bhatti | G06F 1/20 165/104.33 |
| 2007/0201210 A1* | 8/2007 | Chow | H05K 7/20727 361/704 |
| 2008/0266798 A1* | 10/2008 | Eckberg | H05K 7/20272 361/699 |

* cited by examiner

WATER COOLING SYSTEM OF SINGLE BOARD MODULE LEVEL

This is a National Phase Application filed under 35 U.S.C. 371 as a national stage of PCT/CN2016/073883, filed Feb. 16, 2016, an application claiming the benefit of Chinese Application No. 201520535827.2, filed Jul. 23, 2015, the content of each of which is hereby incorporated by reference in its entirety.

FIELD OF THE INVENTION

The present disclosure relates to the field of electronic communication devices, and for example, to a water cooling system of single board module level for device subracks.

BACKGROUND

In recent years, with a constant development of internet technologies, many communication devices, network devices, and data devices are integrated into one subrack to form a device subrack. As electronic devices such as communication devices, network devices and data devices become more and more integrated and get larger and larger in scale, heat density inside the device subrack is getting higher and higher so that heat load of an entire cabinet for installing the device subrack is increasing greatly. Water cooling is gradually applied to heat dissipation in the field of electronic communication due to its high thermal conduction efficiency.

Currently, the manner of a common water cooling heat dissipation is to install a water cooling heat dissipation subrack independent from the device subrack in the cabinet. This manner has the following disadvantages: firstly, the water cooling heat dissipation subrack independently installed in the cabinet occupies a large space within the cabinet; and secondly, both of plug/pull process and liquid supply process of the water cooling heat dissipation subrack are required to be controlled manually, resulting in low ability and efficiency in the thermal conduction of the system; thirdly, the water cooling heat dissipation subrack may drip water when being controlled manually, and water exists within a water cooling pipe in a single board pulled out.

SUMMARY

Embodiments of the present disclosure are provided to overcome the above problems. An embodiment of the present disclosure provides a water cooling system of single board module level in which a single board water cooling module that enables hot plug/pull is installed on each single board module, and the system can realize a function of automatically supplying/pumping liquid to/from the single board water cooling module, is simple in structure and space-saving, has no water in the single board which is pulled out, and is high in device maintenance efficiency.

The embodiments of the present disclosure provides the following technical solutions:

A water cooling system of single board module level, including: a device subrack having a backplate; a plurality of single board modules located on one side of the backplate; one single board water cooling module or a plurality of serially connected single board water cooling modules installed on each of the single board modules, each single board water cooling module having liquid that cools a heating element of the single board module; a plurality pairs of sealing plug-connection units installed on the backplate, each pair of sealing plug-connection units being connected with the single board water cooling module or the plurality of serially connected single board water cooling modules on a corresponding single board module; a plurality of water pump modules located on the other side of the backplate, each of the water pump modules being connected with the single board water cooling module or a the plurality of serially connected single board water cooling modules on a corresponding single board module via a corresponding pair of sealing plug-connection units, wherein each sealing plug-connection unit in each pair of sealing plug-connection units includes two parts which are plug-connected, a first part of the two parts is installed on a corresponding single board module and is connected with the single board water cooling module or the plurality of serially connected single board water cooling modules on the corresponding single board module, and a second part of the two parts is installed on the backplate and is connected with a corresponding water pump module.

The water cooling system of single board module level may further include a control board configured to control the water pump modules to supply cooling liquid to the single board water cooling modules and to pump the cooling liquid from the single board water cooling modules.

The water cooling system of single board module level may further include a water reservoir configured to supply the cooling liquid to the single board water cooling modules, wherein the water reservoir and each of the water pump modules, each of the water pump modules and a corresponding sealing plug-connection unit, as well as each sealing plug-connection unit and a corresponding single board water cooling module, are connected by a circulation pipe therebetween.

A first part of the sealing plug-connection unit may be a fixed male terminal, the fixed male terminal is fixedly installed on the single board module, and one end of the fixed male terminal is connected to the single board water cooling module through the circulating pipe; a second part of the sealing plug-connection unit may be a floating female terminal, the floating female terminal is installed on the backplate, one end of the floating female terminal is connected to a water pump module via the circulating pipe, and the other end of the floating female terminal is sealingly plug-connected to the other end of the fixed male terminal; wherein a primary sealing unit and a secondary oblique sealing unit which achieve a sealing plug-connection between the fixed male terminal and the floating female terminal are installed on the other end of the fixed male terminal.

A toggle switch connected to the control board and configured to send a toggle signal to the control board and an indicator light configured to indicate a state in which the cooling liquid is being pumped by the water pump module may be provided on the single board module.

A wrench and a micro switch in contact with the wrench may be installed on the single board module, and the micro switch is connected to the control board and is configured to send a signal indicating that the single board module is installed in position to the control board.

The circulation pipe may have an inlet pipe and a return pipe, and the water pump module includes: an one-way valve connected to the inlet pipe, the one-way valve being connected to the control board and being configured to receive a start/stop signal of the one-way valve sent from the control board; a water pump connected to the return pipe, the water pump being connected to the control board and being configured to receive a start/stop signal of the water pump sent by the control board.

The circulation pipe may be installed with a flood sensor (e.g., in a lower portion of the circulation pipe or at the lowest position of the circulation pipe, etc.), and the flood sensor is connected to the control board and is configured to send a signal indicating whether the circulation pipe leaks, to the control board.

The floating female terminal may be installed on the backplate by a bolt and a nut.

A bore diameter of an installation bore in the floating female terminal for a bolt to be inserted into the installation bore may be larger than an outer diameter of the bolt so as to form a radial clearance for a radial fine adjustment, so as to achieve axial auto-centering of the floating female terminal and the fixed male terminal.

The embodiment of the present disclosure has beneficial effects in the following aspects:

In the embodiment of the present disclosure, a single board water cooling module is installed on each single board module of a device subrack, is connected to a water pump module through a plug-connection unit, and can be plugged and pulled at any time under the control of a control board, which is convenient for use and space-saving;

in the embodiment of the present disclosure, a water pump module connected to a single board water cooling module through a plug-connection unit is connected to a control board, it is thus possible to realize a function of automatically supplying cooling liquid to the single board water cooling module and automatically pumping the cooling liquid from the single board water cooling module;

in the embodiment of the present disclosure, under the function of a controller, a water cooling function of one single board module or a water cooling function of multiple water cooling modules can be implemented.

BRIEF DESCRIPTION OF THE DRAWINGS

FIG. 2b is an enlarged schematic structural diagram of a portion A shown in FIG. 2a;

Figure 1A:
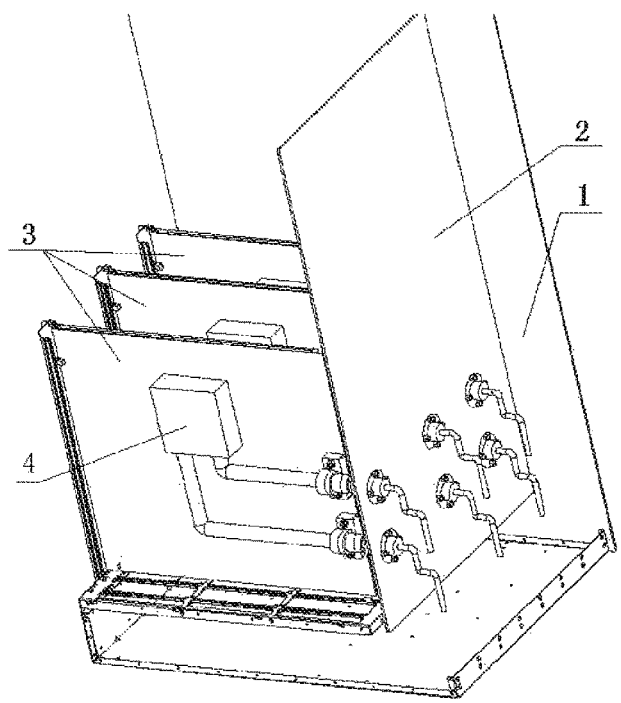
FIGS. 1a and 1b are schematic structural diagrams showing a single board water cooling module according to an embodiment of the present disclosure installed on a single board module of a device subrack.

DESCRIPTION OF REFERENCE NUMERALS 1 device subrack, 2 backplate, 3 single board module, 4 single board water cooling module, 5 sealing plug-connection unit, 51 fixed male terminal 52, floating female terminal, 6 circulation pipe, 7 micro switch, 8 wrench, 9 toggle switch, 10 indicator light, 11 water pump module, 111 water pump, 112 one-way valve, 12 bolt/nut, 13 primary sealing unit, 14 secondary oblique sealing unit, 15 control board, 16 water reservoir, 17 flood sensor.

DETAILED DESCRIPTION OF THE EMBODIMENTS

Figure 1B:
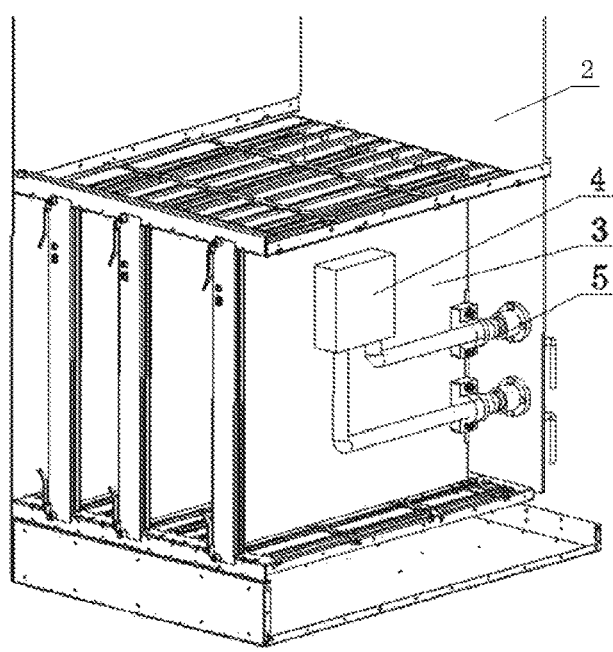
Figure 4:
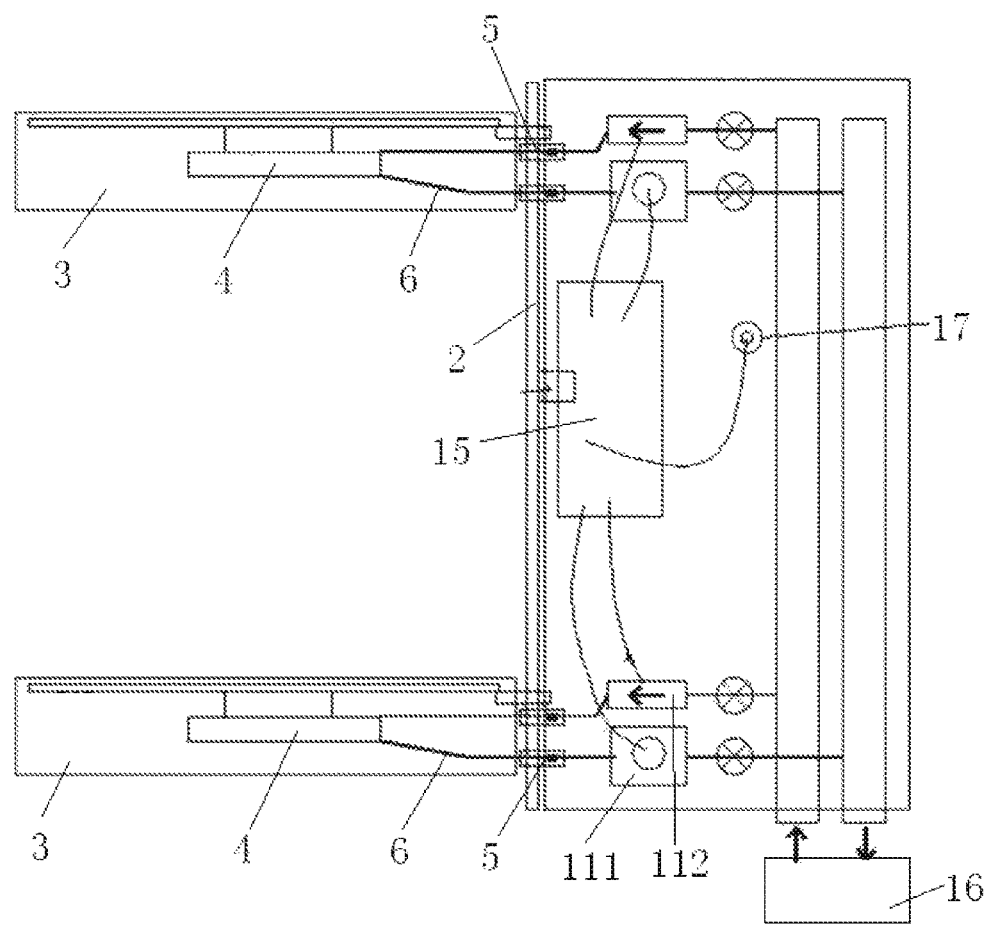
FIG. 4 is a schematic structural diagram of the water cooling system of single board module level according to an embodiment of the present disclosure.

An embodiment of the present disclosure provides a water cooling system of single board module level which can not only realize water cooling control for one single board module but also realize water cooling control for a plurality of single board modules. As shown in FIGS. 1a, 1b and 4, the water cooling system of single board module level includes: a device subrack 1 having a backplate 2; a plurality of single board modules 3 located on one side of the backplate; single board water cooling modules 4, each of which is installed on the respective one of the single board modules 3, each single board water cooling module 4 having liquid that cools a heating element of one of the single board modules 3 corresponding to the single board water cooling module; a plurality pairs of sealing plug-connection units 5 installed on the backplate, each pair of sealing plug-connection units 5 being connected with one of the single board water cooling modules 4; a plurality of water pump modules 11 located on the other side of the backplate, each of the water pump modules 11 being connected with one of the single board water cooling modules 4 via a pair of sealing plug-connection units 5; a control board 15 configured to control one or more of the water pump modules 11 to supply cooling liquid to the single board water cooling modules 4 connected thereto and to pump the cooling liquid from the single board water cooling modules 4; a water reservoir 16 configured to supply the cooling liquid to the single board water cooling modules 4; wherein the water reservoir 16 and each of the water pump modules 11, each of the water pump modules 11 and the corresponding sealing plug-connection unit 5, as well as each of the single board water cooling module 4 and the corresponding sealing plug-connection unit 5, are connected by a circulation pipe 6 therebetween.

A system structure and its operating principle of the embodiment of the present disclosure will be described in detail below with reference to the accompanying drawings.

Figure 2A:
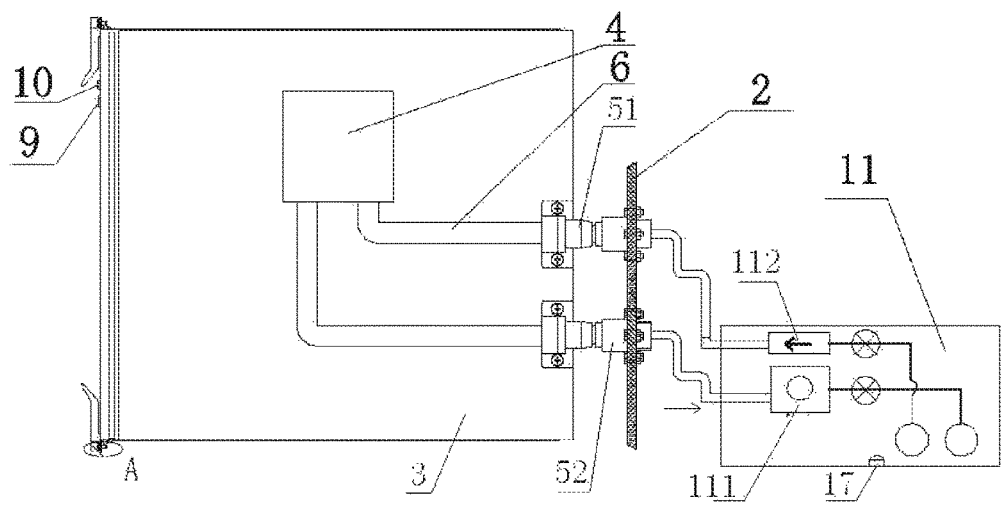
FIG. 2a is a schematic diagram of a circulation path of a water cooling system of single board module level according to an embodiment of the present disclosure.
Figure 3:
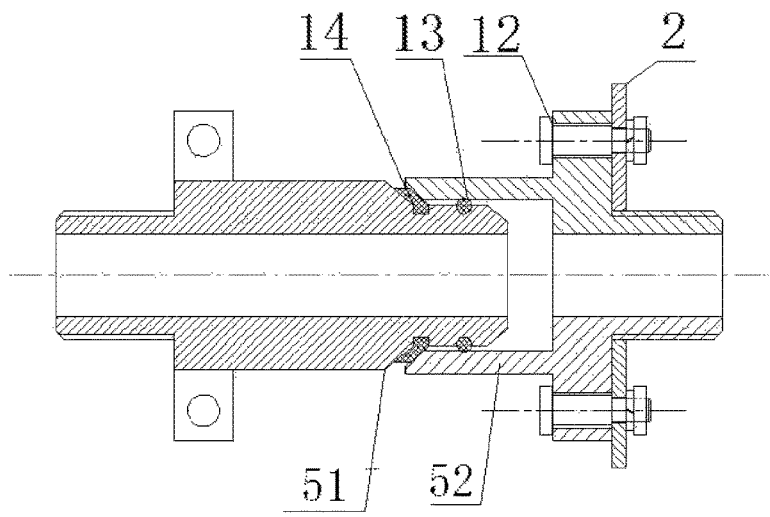
FIG. 3 is a schematic structural diagram of a sealing plug-connection unit according to an embodiment of the present disclosure.

As shown in FIGS. 2a and 3, each sealing plug-connection unit 5 in each pair of sealing plug-connection units 5 includes two parts which are plug-connected. A first part is a fixed male terminal 51, the fixed male terminal 51 is fixedly installed on a single board module 3, and one end of the fixed male terminal 51 is connected to the single board water cooling module 4 through the circulating pipe 6; a second part is a floating female terminal 52, the floating female terminal 52 is installed on the backplate 2, one end of the floating female terminal 52 is connected with a water pump module 11 via the circulating pipe 6, and the other end of the floating female terminal 52 is sealingly plug-connected to the other end of the fixed male terminal 51. As shown in FIG. 3, a chamfer convenient for a quick blind insertion is designed on a head portion of the other end of the fixed male terminal 51 to be inserted into the floating female terminal 52. A primary sealing unit 13 and a secondary oblique sealing unit 14 which achieve a sealing plug-connection between the fixed male terminal 51 and the floating female terminal 52 are installed on a body portion of the other end of the fixed male terminal 51 to be inserted into the floating female terminal 52. Such a double-sealing unit realizes a dual function of both sealing and positioning.

The primary sealing unit 13 is a rough positioning and fitting unit to achieve a primary insertion and positioning of the fixed male terminal 51; and the secondary oblique sealing unit 14 is an accurate positioning and fitting unit to achieve centering and tight fitting of the fixed male terminal 51 and the floating female terminal 52. The primary sealing unit 13 and the secondary oblique sealing unit 14 are sealing gaskets. The floating female terminal 52 is installed on the backplate 2 by a bolt and a nut 12.

As shown in FIG. 2a, one single board water cooling module 4 is connected to one water pump module 11 via a pair of sealing plug-connection units 5. Each single board water cooling module 4 corresponds to a respective one of the single board module 3. In addition, in the embodiment of the present disclosure, each single board module 3 has a plurality of serially connected single board water cooling modules 4 installed thereon, and when a single board module 3 has a plurality of heating elements thereon, each of the plurality of serially connected single board water cooling modules 4 cools the respective one of the heating elements to improve heat dissipation efficiency. A toggle switch 9 and an indicator light 10 are provided on the single board module 3. The toggle switch 9 is connected to the control board 15 and is configured to send a toggle signal to the control board 15; the indicator light 10 is connected to the control board 15 and is configured to indicate a state in which the cooling liquid is being pumped by the water pump module.

Figure 2B:
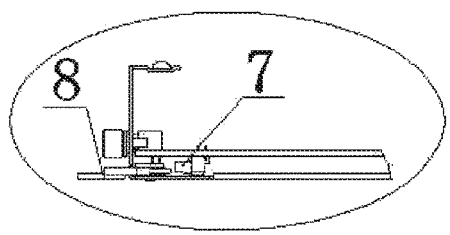

As shown in FIG. 2b, a wrench 8 and a micro switch 7 in contact with the wrench 8 are installed on the single board module 3. The micro switch 7 is connected to the control board 15 and is configured to send a signal indicating that the single board module is installed in position, to the control board 15.

As shown in FIG. 2a, the circulation pipe has an inlet pipe and a return pipe. The water pump module 11 includes: an one-way valve 112 connected to the inlet pipe, the one-way valve 112 being connected to the control board 15 and being configured to receive a start/stop signal of the one-way valve sent from the control board 15; and a water pump 111 connected to the return pipe, the water pump 111 being connected to the control board 15 and being configured to receive a start/stop signal of the water pump sent by the control board.

As shown in FIG. 2a, the circulation pipe is installed with a flood sensor 17 (e.g., in a lower portion of the circulation pipe or at the lowest position of the circulation pipe, etc.), and the flood sensor 17 is connected to the control board 15 and is configured to send a signal indicating whether the circulation pipe leaks, to the control board.

A single board water cooling module 4 of the embodiment of the present disclosure is sealingly plug-connected to one of the water pump modules 11 via the plug-connection units 5. The process that the sealingly plug-connected water pump module 11 automatically supplies the liquid to the single board water cooling module 4 is as follows: the wrench 8 is pulled into a trigger position to trigger the micro switch 7 to send the single indicating that the single board module is installed in position, to the control board 15; the control panel 15 which receives the signal sends a start signal to the one-way valve 112 and the water pump 111; then the one-way valve 112 is opened and the water pump begins to operate, and the cooling liquid is pumped from the water reservoir by the water pump and supplied to the single board water cooling module 4, achieving an automatic circulation for liquid supply.

In the embodiment of the present disclosure, board pulling (pulling up of the single board module) is initiated as follows: the toggle switch 9 is turn on; the toggle switch 9 sends a toggle signal to the control board 15; then the control board 15 which receives the signal sends a close signal to the one-way valve 112; the one-way valve 112 is closed, and the cooling liquid is pumped from the single-plate water cooling module 4 by the water pump. The indicator light 10 flashes red when the cooling liquid is being pumped and the indicator light 10 is steady in green after the cooling liquid is pumped off. At this time, the single board module can be pulled up.

Although the foregoing describes the embodiment of the present disclosure in detail, the present disclosure is not limited thereto, and modifications may be made by those skilled in the art according to the principles of the embodiment of the present disclosure. Therefore, various modifications made according to the principles of the embodiment of the present disclosure should be understood as falling within the protection scope of the present disclosure.

INDUSTRIAL APPLICABILITY

The present disclosure discloses a water cooling system of single board module level, including: a device subrack having a backplate; a plurality of single board modules located on one side of the backplate; a plurality of single board water cooling modules correspondingly installed on each of the single board modules, the single board water cooling modules having liquid that cools heating elements of the single board modules; a plurality of sealing plug-connection units installed on the backplate and connected to the plurality of single board water cooling modules; a plurality of water pump modules connected to the single board water cooling modules via the plurality of plug-connection units and located on the other side of the backplate; wherein each sealing plug-connection unit includes two parts which are plug-connected, a first part of the two parts is installed on the single board module and is connected with one single board water cooling module, and a second part of the two parts is installed on the backplate and is connected with one water pump module. The water cooling system of single board module level disclosed in the present disclosure is simple in structure, is space-saving and is high in device maintenance efficiency.

What is claimed is:

1. A water cooling system of single board module level, comprising:
    a device subrack having a backplate;
    a plurality of single board modules located on one side of the backplate;
    a single board water cooling module installed on each of the single board modules, each single board water cooling module having liquid that cools a heating element of the single board module;
    a plurality pairs of sealing plug-connection units installed on the backplate, each pair of sealing plug-connection units being connected with the single board water cooling module on a corresponding single board module;
    a plurality of water pump modules located on the other side of the backplate, each of the water pump modules being connected with a corresponding single board water cooling module via a corresponding pair of sealing plug-connection units,
    wherein each sealing plug-connection unit in each pair of sealing plug-connection units comprises two parts which are plug-connected, wherein a first part of the two parts is installed on a corresponding single board module and is connected with the single board water cooling module on the corresponding single board module, and a second part of the two parts is installed on the backplate and is connected with a corresponding water pump module.

2. The water cooling system of single board module level according to claim 1, further comprising a control board configured to control the water pump modules to supply cooling liquid to the single board water cooling modules and to pump the cooling liquid from the single board water cooling modules.

3. The water cooling system of single board module level according to claim 2, further comprising a water reservoir configured to supply the cooling liquid to the single board water cooling modules, wherein
the water reservoir and each of the water pump modules, each of the water pump modules and a corresponding sealing plug-connection unit, as well as each sealing plug-connection unit and a corresponding single board water cooling module, are connected by a circulation pipe therebetween.

4. The water cooling system of single board module level according to claim 3, wherein the first part of each sealing plug-connection unit is a fixed male terminal, the fixed male terminal is fixedly installed on the single board module, and one end of the fixed male terminal is connected to the single board water cooling module through the circulating pipe; a second part of each sealing plug-connection unit is a floating female terminal, the floating female terminal is installed on the backplate, one end of the floating female terminal is connected to a water pump module via the circulating pipe, and the other end of the floating female terminal is sealingly plug-connected to the other end of the fixed male terminal,
wherein the other end of the fixed male terminal is installed with a primary sealing unit and a secondary oblique sealing unit which achieve a sealing plug-connection between the fixed male terminal and the floating female terminal.

5. The water cooling system of single board module level according to claim 4, wherein a toggle switch connected to the control board and configured to send a toggle signal to the control board and an indicator light configured to indicate a state in which the cooling liquid is being pumped by the water pump module are provided on the single board module.

6. The water cooling system of single board module level according to claim 5, wherein a wrench and a micro switch in contact with the wrench are installed on the single board module, and the micro switch is connected to the control board and is configured to send a signal indicating that the single board module is installed in position, to the control board.

7. The water cooling system of single board module level according to claim 6, wherein the circulation pipe has an inlet pipe and a return pipe, and the water pump module comprises:
an one-way valve connected to the inlet pipe, the one-way valve being connected to the control board and being configured to receive a start/stop signal of the one-way valve sent from the control board;
a water pump connected to the return pipe, the water pump being connected to the control board and being configured to receive a start/stop signal of the water pump sent by the control board.

8. The water cooling system of single board module level according to claim 7, wherein the circulation pipe is installed with a flood sensor, and the flood sensor is connected to the control board and is configured to send a signal indicating whether the circulation pipe leaks, to the control board.

9. The water cooling system of single board module level according to claim 4, wherein the floating female terminal is installed on the backplate by a bolt and a nut.

10. The water cooling system of single board module level according to claim 9 wherein a bore diameter of an installation bore in the floating female terminal for a bolt to be inserted into the installation bore is larger than an outer diameter of the bolt so as to form a radial clearance for a radial fine adjustment.

11. A water cooling system of single board module level, comprising:
a device subrack having a backplate;
a plurality of single board modules located on one side of the backplate;
a plurality of serially connected single board water cooling modules installed on each of the single board modules, each single board water cooling module having liquid that cools a heating element of the single board module;
a plurality pairs of sealing plug-connection units installed on the backplate, each pair of sealing plug-connection units being connected with the plurality of serially connected single board water cooling modules on a corresponding single board module;
a plurality of water pump modules located on the other side of the backplate, each of the water pump modules being connected with the plurality of serially connected single board water cooling modules on a corresponding single board module via a corresponding pair of sealing plug-connection units,
wherein each sealing plug-connection unit in each pair of sealing plug-connection units comprises two parts which are plug-connected, wherein a first part of the two parts is installed on a corresponding single board module and is connected with the plurality of serially connected single board water cooling modules on the corresponding single board module, and a second part of the two parts is installed on the backplate and is connected with a corresponding water pump module.

12. The water cooling system of single board module level according to claim 11, further comprising a control board configured to control the water pump modules to supply cooling liquid to the single board water cooling modules and to pump the cooling liquid from the single board water cooling modules.

13. The water cooling system of single board module level according to claim 12, further comprising a water reservoir configured to supply the cooling liquid to the single board water cooling modules, wherein
the water reservoir and each of the water pump modules, each of the water pump modules and a corresponding sealing plug-connection unit, as well as each sealing plug-connection unit and the plurality of serially connected single board water cooling modules on a corresponding single board module, are connected by a circulation pipe therebetween.

14. The water cooling system of single board module level according to claim 13, wherein the first part of each sealing plug-connection unit is a fixed male terminal, the fixed male terminal is fixedly installed on the single board module, and one end of the fixed male terminal is connected to a corresponding single board water cooling module through the circulating pipe; a second part of each sealing plug-connection unit is a floating female terminal, the floating female terminal is installed on the backplate, one end of the floating female terminal is connected to a water pump module via the circulating pipe, and the other end of the floating female terminal is sealingly plug-connected to the other end of the fixed male terminal, wherein the other end of the fixed male terminal is installed with a primary sealing unit and a secondary oblique sealing unit which achieve a sealing plug-connection between the fixed male terminal and the floating female terminal.

15. The water cooling system of single board module level according to claim 14, wherein a toggle switch connected to the control board and configured to send a toggle signal to the control board and an indicator light configured to indicate a state in which the cooling liquid is being pumped by the water pump module are provided on the single board module.

16. The water cooling system of single board module level according to claim 15, wherein a wrench and a micro switch in contact with the wrench are installed on the single board module, and the micro switch is connected to the control board and is configured to send a signal indicating that the single board module is installed in position, to the control board.

17. The water cooling system of single board module level according to claim 16, wherein the circulation pipe has an inlet pipe and a return pipe, and the water pump module comprises:

an one-way valve connected to the inlet pipe, the one-way valve being connected to the control board and being configured to receive a start/stop signal of the one-way valve sent from the control board;

a water pump connected to the return pipe, the water pump being connected to the control board and being configured to receive a start/stop signal of the water pump sent by the control board.

18. The water cooling system of single board module level according to claim 17, wherein the circulation pipe is installed with a flood sensor, and the flood sensor is connected to the control board and is configured to send a signal indicating whether the circulation pipe leaks, to the control board.

19. The water cooling system of single board module level according to claim 14, wherein the floating female terminal is installed on the backplate by a bolt and a nut.

20. The water cooling system of single board module level according to claim 19 wherein a bore diameter of an installation bore in the floating female terminal for a bolt to be inserted into the installation bore is larger than an outer diameter of the bolt so as to form a radial clearance for a radial fine adjustment.

* * * * *